United States Patent
Zwemstra et al.

[11] Patent Number: 6,097,194
[45] Date of Patent: Aug. 1, 2000

[54] METHOD AND APPARATUS FOR OBTAINING TRANSFER CHARACTERISTICS OF A DEVICE UNDER TEST

[75] Inventors: Taco Zwemstra, Nijmegen; Gerardus P. H. Seuren, Eindhoven; Marc T. Looijer, Eindhoven; Augustus J. E. M. Janssen, Eindhoven, all of Netherlands

[73] Assignee: U.S. Philips Corporation, New York, N.Y.

[21] Appl. No.: 09/070,217

[22] Filed: Apr. 30, 1998

[30] Foreign Application Priority Data

May 15, 1997 [EP] European Pat. Off. .............. 97201468

[51] Int. Cl.$^7$ .................................................. G01R 27/00
[52] U.S. Cl. ........................................ 324/615; 324/76.19
[58] Field of Search .................................... 324/615, 613, 324/620, 76.27

[56] References Cited

U.S. PATENT DOCUMENTS

| | | | |
|---|---|---|---|
| 4,264,859 | 4/1981 | Blaess | 324/615 |
| 4,539,683 | 9/1985 | Hahn et al. | 371/15 |
| 4,613,814 | 9/1986 | Penney | 324/615 |
| 4,858,142 | 8/1989 | Jenq et al. | 364/487 |
| 4,896,271 | 1/1990 | Jenq et al. | 364/487 |
| 5,081,592 | 1/1992 | Jenq | 364/487 |
| 5,132,685 | 7/1992 | DeWitt et al. | 341/120 |

FOREIGN PATENT DOCUMENTS

| | | | |
|---|---|---|---|
| 0308599A2 | 3/1989 | European Pat. Off. | H03M 1/10 |
| 08335877 | 12/1996 | Japan | H03M 1/10 |

OTHER PUBLICATIONS

"DSP Synthesized Signal Source for Analog Testing Stimulus and New Test Method", H. Kitayoshi et al., International Test Conference 1985 Proceedings, IEEE Computer Society Press, Nov. 1985.

*Primary Examiner*—Josie Ballato
*Assistant Examiner*—Vincent Q. Nguyen
*Attorney, Agent, or Firm*—Brian J. Wieghaus

[57] ABSTRACT

The invention relates to a time domain method for obtaining transfer characteristics of a device under test (DUT). The method comprises the steps of applying a sine sweep and a cosine sweep to an input of the DUT, and measuring response signals at an output of the DUT. The sine sweep and cosine sweep together establish a complex input signal, whereby to each instant there is related a particular frequency. Similarly, the respective response signals together establish a complex response signal. The magnitudes and phases of both complex signals are calculated and the transfer characteristics of the DUT then follow from the magnitude ratio and the phase difference of the input signal and the response signal. The invention also relates to an arrangement for testing transfer characteristics of a DUT and to an integrated circuit comprising the necessary elements for testing a subcircuit contained therein.

7 Claims, 2 Drawing Sheets

METHOD AND APPARATUS FOR OBTAINING TRANSFER CHARACTERISTICS OF A DEVICE UNDER TEST

BACKGROUND OF THE INVENTION

The invention relates to a method for obtaining transfer characteristics of a device under test (DUT) as a function of frequency, the method comprising the steps of:

(1) applying a sine sweep $x_1[n]$ to an input of the DUT, with n designating a time index;

(2) measuring a response signal $y_1[n]$ at an output of the DUT

The invention further relates to an arrangement for obtaining transfer characteristics of a DUT as a function of frequency. The invention further relates to an integrated circuit (IC) comprising a waveform generator, a digital signal processing means and a subcircuit with transfer characteristics to be tested.

A method as specified in the preamble is known from article "DSP synthesized signal source for analog testing stimulus and new test method", H. Kitayoshi et al., International Test Conference 1985 Proceedings, IEEE Computer Society Press, November 1985. In the known method, an input signal in the form of a sine sweep (also 'swept sine' or 'frequency-swept sinewave') is applied to an analog DUT and a response signal of the DUT is measured. Subsequently, a transfer function of the DUT is estimated with the aid of a frequency domain analysis of the input signal and the response signal. For both the construction of the input signal and the postprocessing a digital signal processor (DSP) is used.

DSPs offer a lot of possibilities with respect to both the generation of input stimuli and the postprocessing of the obtained response signals. Of course, when the DUT has an analog input and/or an analog output, as for instance with an analog filter or a digital-to-analog converter (DAC), separate DACs and/or analog-to-digital converters (ADCs) are required in a test environment in which the method is applied, in order to be able to use a DSP for signal generation and/or postprocessing. In order to maintain clarity of the text, we will only describe digital signals being applied to and obtained from the DUT, whereas it is silently understood that, if necessary, appropriate conversions for interfacing with the DUT take place.

A sine sweep is a sinusoidal signal with a varying instantaneous frequency. Sine sweeps have the advantage over other input stimuli, like multi-tone signals, that they not only have a low crest factor, but in addition are robust with respect to non-linear phase changes and can be easily adapted to cover a particular frequency range of interest.

A prerequisite of the known method is that a Fourier transformation needs to be applied to the input signal and to the response signal. Fourier transformations are time-consuming and put a burden on test system resources.

SUMMARY OF THE INVENTION

It is, inter alia, an object of the invention to provide a method as specified in the preamble, that does not rely on Fourier transformations. To this end, the invention provides a method as specified in the preamble that is characterized in that the method further comprises the steps of:

(3) applying a cosine sweep $x_2[n]$ to an input of the DUT;

(4) measuring a response signal $y_2[n]$ at the output of the DUT.

The cosine sweep $x_1[n]$ is here defined as a particular sine sweep that is orthogonal to the sine sweep $x_2[n]$, meaning that for each n, $x_1[n]$ and $x_2[n]$ are associated with, at least approximately, the same instantaneous frequency, whereas their phase difference is $\pi/2$. In this way, a complex input signal of the form $e^{j2\pi\phi[n]}$ with a phase function $\phi[n]$ is emulated, and a complex response of the DUT is measured. Using this terminology, $x_1[n]$ and $y_1[n]$ establish the imaginary part of the complex input signal and the complex response signal, respectively, and $x_2[n]$ and $y_2[n]$ establish the real part of the complex input signal and complex response signal, respectively. During the sweeps, an instantaneous frequency of the input signal, defined as a time derivative $\phi'[n]$ of the phase function $\phi[n]$, is varied in order to cover a frequency range of interest.

Such a kind of input signal allows frequency-dependent transfer characteristics of the DUT to be determined without using Fourier transformations, as will be explained in the following. Magnitude and phase information of the complex input and response signals at a certain frequency are readily available from well-known formulas. These formulas relate the magnitude M and phase F of a complex quantity C to the real part Re(C) and imaginary part Im(C) of the complex quantity C in the following manner: $M = \sqrt{Re^2(C) + Im^2(C)}$ and F=arctan(Im(C)/Re(C)). Moreover, said magnitude and phase information can be related to a certain frequency via a known time dependence of the instantaneous frequency of the input signal $\phi'[n]$. Thus, magnitude and phase of input and response signals can be obtained without Fourier transformations, allowing frequency-dependent transfer characteristics related to these entities to be determined in a simple manner.

A further advantage of the method according to the invention is that test time can be sacrificed for higher test accuracy, and vice versa. Inherently, the method leads to more precise results when the instantaneous frequency function $\phi'[n]$ of the sweeps varies less rapidly. A sweep of slowly varying instantaneous frequency is, at some instant, a better approximation of a single frequency sinewave than a sweep of rapidly varying instantaneous frequency. In a similar manner, with the method according to the invention it is possible to zoom in on certain frequency ranges of higher interest, e.g. for a filter around a cut-off frequency, by changing the instantaneous frequency $\phi'[n]$ in these frequency ranges less rapidly than in the remaining frequency ranges.

The measure as defined in Claim 2 has the advantage that a very simple method is provided for estimating a magnitude and a phase of a transfer function of the DUT, that can easily be implemented with a DSP or other digital signal processing means. Transfer functions are important quantities in the characterization of linear, time-invariant systems.

The measure as defined in Claim 3 has the advantage that a very simple method is provided for estimating noise and distortion specifications of the converter under test, that can easily be implemented with a DSP or other digital signal processing means.

An arrangement for estimating transfer characteristics of a device according to the invention is characterized in that the arrangement comprises:

(1) a waveform generator arranged to provide an input of the DUT with a concatenation of a sine sweep and a cosine sweep;

(2) a digital signal processing means arranged for analyzing a response signal of the DUT.

An IC according to the invention is characterized in that (1) the IC comprises control circuitry for in a test mode controlling the waveform generator and the digital signal processing means;

(2) the waveform generator is arranged for in the test mode providing an input of the subcircuit with a concatenation of a sine sweep and a cosine sweep;

(3) the digital signal processing means is arranged for in the test mode analyzing a response signal of the subcircuit.

This so-called Built-In Self Test (BIST) solution has the advantage that the test environment is less involved in the actual testing since use is made of elements present on the IC itself. The necessary elements for the testing either are included in the IC for establishing in a normal mode some function of the IC or are included in the IC solely for test purposes.

BRIEF DESCRIPTION OF THE DRAWINGS

The invention is further explained below by way of example, with reference to the accompanying drawing in which.

DETAILED DESCRIPTION OF THE PREFERRED EMBODIMENT

Figure 1:
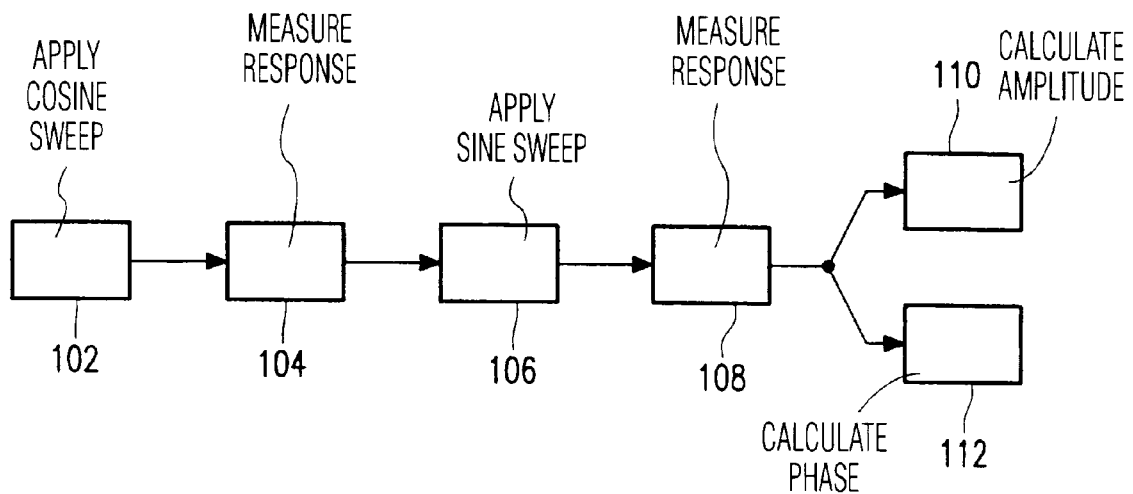
FIG. 1 is a flow chart of an embodiment of a method according to the invention for estimating a transfer function of a DUT.

FIG. 1 is a flow chart of an embodiment of a method according to the invention for estimating a transfer function of a DUT. In a first step 102, to an input of the DUT a cosine sweep $x_2[n]$ is applied. The sweep is composed of a cosine of a function $2\pi\phi[n]$ which varies as $n^2$, so that the instantaneous frequency $\phi'[n]$ of the cosine sweep varies as n. In a second step 104, which coincides with step 102, a response signal $y_2[n]$, appearing at an output of the DUT as a result of the cosine sweep, is measured.

In a third step 106, to an input of a DUT a sine sweep $x_1[n]$ is applied. Comparable to the cosine sweep, the sine sweep is composed of a sine of the function $2\pi\phi[n]$. In a fourth step 108, which coincides with step 106, a response signal $y_1[n]$, appearing at the output of the DUT as a result of the sine sweep, is measured.

Per sweep, N samples are taken at a sampling frequency $F_s$, whereas the start frequency is $F_b$ and the stop frequency is $F_e$. This is realized by taking $$\varphi[n] = \frac{1}{2N}(F_e - F_b)n^2 + F_b n,$$

from which follows the instantaneous frequency $$f[n] = \frac{1}{N}(F_e - F_b)n + F_b.$$

Other (e.g. non-quadratic) functions $\phi[n]$ are possible. When the DUT is involved in audio signal processing, $F_s$ could be 44.1 kHz, and $F_b$ and $F_e$, 0.02 and 0.48 times $F_s$, respectively. By taking more samples N per sweep and keeping the sample frequency $F_s$ the same, higher accuracy can be achieved at the price of longer test duration.

The input signals and the response signals constitute a complex input signal and a complex response signal, respectively. Hereto, the two constituting parts of the complex input signal are orthogonal to each other, meaning that for each n they are associated with the same instantaneous frequency, whereas their phase difference is $\pi/2$. In order to guarantee this orthogonality, an accurate timing relationship is required between the instant of starting the sweeps and the start of the sampling process. An alternative way to realize the same objective is be to use a single input signal comprising a concatenation of the cosine sweep and the sine sweep, each sweep having a duration equal to an integer number of sampling intervals, a sampling interval being the amount of time between two sample moments.

The indicated order of the applied input signals is not essential. Therefore, it is also possible to carry out the step 102 of applying a cosine sweep $x_2[n]$ and the step 104 of measuring a response signal $y_2[n]$, after the step 106 of applying a sine sweep $x_1[n]$ and the step 108 of measuring a response signal $y_1[n]$.

Finally, with the aid of the measured response signals, an amplitude A[n] and a phase $\Phi[n]$ of the transfer function between the input and the output of the DUT are calculated in steps 110 and 112, respectively. With regard to the complex input signal comprising the real and imaginary parts $x_2[n]$ and $x_1[n]$, the instantaneous magnitude of that signal is $$\sqrt{x_1^2[n] + x_2^2[n]}$$

and the instantaneous phase of that signal is arctan($x_1[n]/x_2[n]$). The magnitude and the phase of the complex response signal, having $y_1[n]$ and $y_2[n]$ as its constituents, can be obtained analogously. The magnitude of the transfer function is defined as the ratio of the magnitudes of the response signal and the input signal. The phase of the transfer function is defined as the phase difference between the response signal and the input signal. Both quantities are a function of instantaneous frequency $\phi'[n]$. Therefore, in the steps 110, 112 of calculating the frequency-dependent amplitude $A(\phi'[n])$ and phase $\Phi(\phi[n])$ of the transfer function between the input and the output of the DUT, the following formulas can be used:

$$A(\varphi'[n]) = \sqrt{\frac{y_1^2[n] + y_2^2[n]}{x_1^2[n] + x_2^2[n]}}, \ \Phi(\varphi'[n]) = \arctan\left(\frac{y_1[n]}{y_2[n]}\right) - \arctan\left(\frac{x_1[n]}{x_2[n]}\right).$$

These formulas define two curves, each curve comprising a sequence of N samples.

Figure 2:
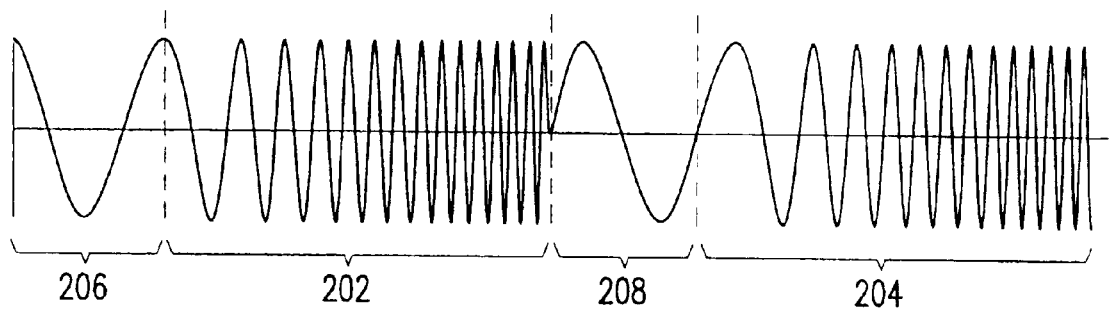
FIG. 2 shows an input signal used in the embodiment of FIG. 1.

FIG. 2 shows an input signal to be used in the first embodiment. The cosine sweep 202 and the sine sweep 204 are concatenated. Alternatively, both the cosine sweep 202 and the sine sweep 204 are preceded by stationary cycles 206, 208. This is done to allow transients to vanish before the relevant measurements start. Another purpose of these stationary cycles 206, 208 could be to use them for estimating the DC component in the response signals. By subtracting the calculated DC component from the obtained response signals before applying the formulas of the previous paragraphs to them, a more accurate estimate of the magnitude and phase transfer of the DUT can be arrived at.

Figure 3:
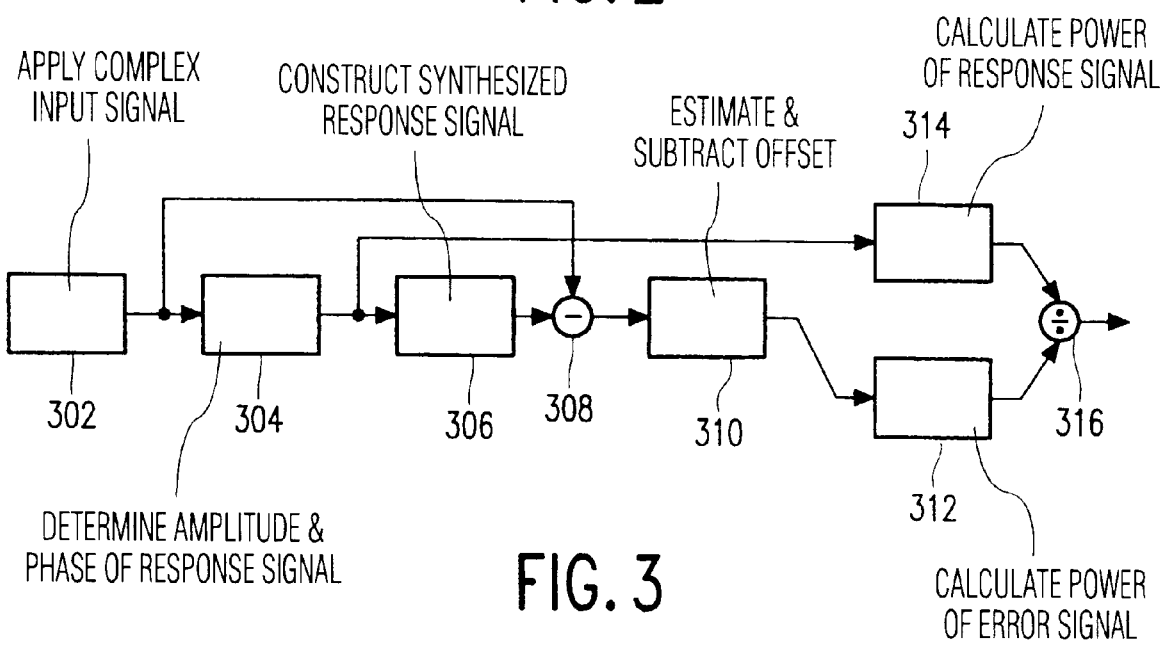
FIG. 3 is a flow chart of an embodiment of a method according to the invention for estimating noise and distortion specifications of a converter.

FIG. 3 is a flow chart of an embodiment of a method according to the invention for estimating noise and distortion specifications of a converter. The converter can be a DAC or an ADC. In step 302 a complex input signal, as the one in FIG. 2, is applied to the converter under test and an actual response signal of the converter is measured. In step 304, for each n an amplitude and a phase of the response signal are determined in the way described in the above paragraphs referring to FIG. 1. The determined amplitude and phase of the response signal are corrected for high frequency corruption caused by whatever kind of noise and non-linearities of the converter. This is done by fitting a low (e.g. $10^{th}$) order polynomial on the determined amplitude and phase of the response signal.

In step 306, on the basis of the thus obtained amplitude and phase of the actual response signal, a synthesized response signal is constructed. This synthesized response signal has the same amplitude and phase characteristics of the actual response signal but lacks noise, distortion and possibly introduced offset, as it is constructed in the digital domain. It suffices to construct either the real part or the imaginary part of the synthesized response signal. The relevant actual response signal and the synthesized response signal are subtracted from each other in step 308, resulting in an error signal. The error signal contains information on the noise and distortion specifications of the converter under test.

From the error signal, in step 310 there is estimated and subtracted an offset. This is accomplished by calculating for each n a mean value of the error signal in a narrow window of 15 samples around n and fitting an offset curve, being a low (e.g. $10^{th}$) order polynomial, on the calculated mean values. The latter is done to suppress high-frequency corruption of the calculated mean values and is based on the assumption that the offset only varies slowly with frequency. Subsequently, the offset curve is subtracted from the error signal in order to arrive at a truly AC error signal. The offset curve is made available in order to provide further specifications of the converter under test.

In step 312 the power $P_{nd}[n]$ of the error signal is calculated, corresponding with the power of noise and distortion of the actual response signal. Generally, the power $P_z$ of a discrete-time signal z is defined as the mean squared value of the signal:

$$P_z = \frac{1}{N}\sum_0^N z^2[n],$$

the calculation extending over all samples of the signal. For this embodiment of the invention, however, we have to apply that definition in a narrow window of, say, 11 samples wide, since otherwise the frequency information would get lost. The rather narrow window leads to an erratic $P_{nd}[n]$-curve, which, again, is mended by fitting a low order polynomial on the curve.

In step 314 the power $P_r[n]$ of the response signal is calculated. The power of a sinewave is defined as the square of its magnitude. For the sweep-like response signal we can use the estimated magnitude of the response signal as obtained in step 304. Finally, in step 316 the ratio of $P_r[n]$ and $P_{nd}[n]$ is calculated for each n. The ratio of signal power and noise and distortion power is known as the Signal-to-Noise-And-Distortion (SINAD) figure. With the known time dependence of the instantaneous frequency of the applied input signal, a SINAD curve is obtained over the frequency range of interest.

Alternatively, in step 304 a magnitude and a phase of a transfer function of the converter could be calculated. By making these quantities available, further specifications of the converter under test are obtained. The synthesized response signal could then be obtained with the help of these quantities, taking the input signal into account.

Figure 4:
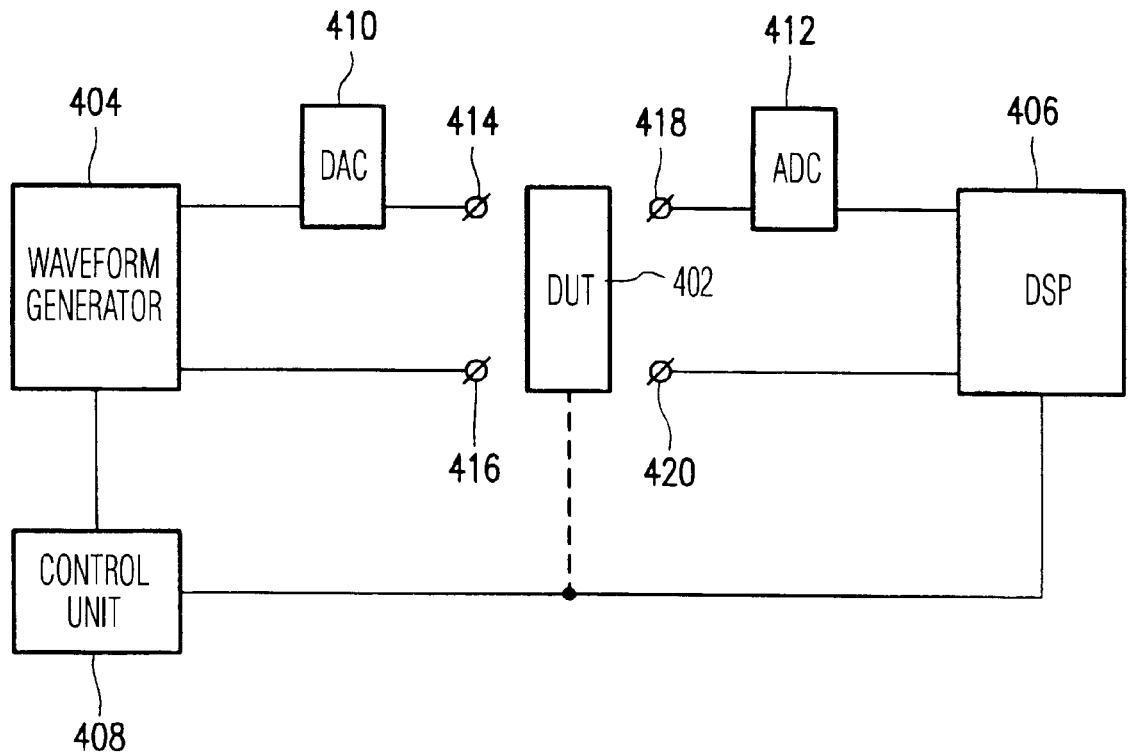
FIG. 4 is a block diagram of an embodiment of an arrangement according to the invention.

FIG. 4 is a block diagram of an embodiment of an arrangement according to the invention. It is suitable for implementing both methods described above. A digital waveform generator 404 is arranged for generating a complex input signal like the one of FIG. 2. A digital signal processing means 406 is included for postprocessing. The digital waveform generator 404, the digital signal processing means 406 and, if necessary, the DUT itself as well, are under control of a control unit 408 for initialization, synchronization and triggering of various events during testing. A DUT 402 can be connected to the arrangement in various ways. A DAC 404 and an ADC 412 are included in the arrangement so that, apart from a digital test input 420 and a digital test output 416, an analog test input 418 and an analog test output 414 are provided. In FIG. 4 it is assumed that the DUT 402 has an analog input and a digital output (e.g. an ADC). Therefore, test output 414 and test input 420 are used.

Here, the digital waveform generator 404 and the digital signal processing means 406 are thought to be independent digital elements, for instance DSPs. Alternatively, digital waveform generator 404 and DAC 410 are integrated in a dedicated waveform generator. Further alternative arrangements are possible, for instance an arrangement in which both the waveform generation and the postprocessing are handled by a single DSP. The block diagram of FIG. 4 provides only an exemplary arrangement along the lines of a logical break-up of the necessary functional elements.

Figure 5:
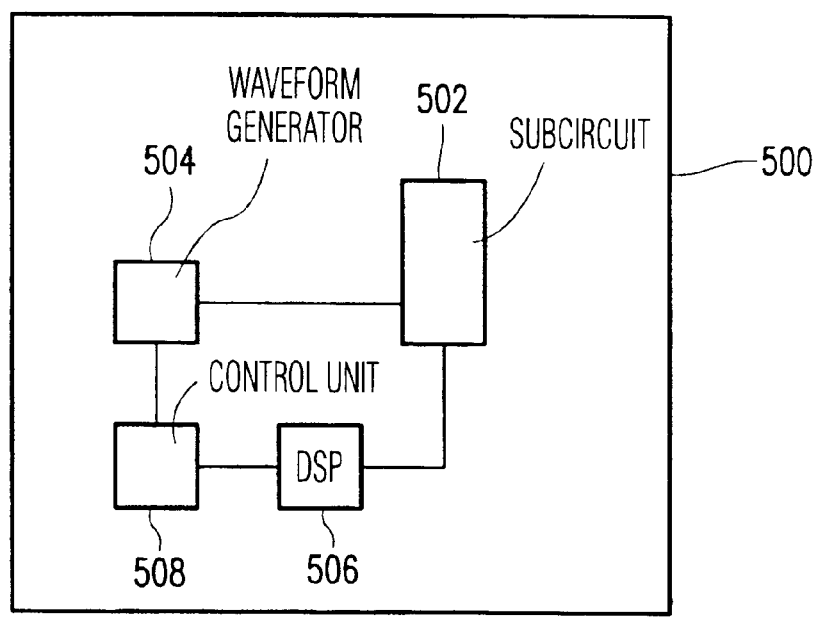
FIG. 5 is a block diagram of an embodiment of an IC according to the invention.

FIG. 5 is a block diagram of an embodiment of an IC according to the invention. Essentially, it comprises a BIST implementation of the arrangement of FIG. 4 for testing one or more subcircuits of the IC itself. A digital waveform generator 504 and a digital signal processing means 506 are assumed to be present on the IC for executing some function in a normal mode of the IC. Control circuitry 508 is provided for, during a test mode, controlling them, and, if necessary for the testing, controlling further elements on the IC.

During the test mode, the digital waveform generator 504 and the digital signal processing means 506 are connected to subcircuit 502, the latter undergoing a test according to one of the previously described methods under control of control circuitry 508. When more subcircuits to be tested analogously are present in the IC, the digital waveform generator 504 and the digital signal processing means 506, in combination with the control circuitry 508, could be used for testing them as well.

What is claimed is:

1. A method for obtaining transfer characteristics of a device under test (DUT) as a function of frequency, the method comprising the steps of:
   measuring a complex response of the DUT by the steps of:
   applying a sine sweep $x_1[n]$ to an input of the DUT, with n designating a time index;
   measuring a response signal $y_1[n]$ at an output of the DUT;
   applying a cosine sweep $x_2[n]$ to an input of the DUT at a fixed time interval from the step of applying the sine sweep $x_1[n]$ to the input of the DUT, and such that the cosine sweep $x_2[n]$, at the same frequency, has a phase difference of 90 degrees with respect to the sine sweep $x_1[n]$;
   measuring a response signal $y_2[n]$ at the output of the DUT.

2. A method for estimating a magnitude A[n] and a phase Φ[n] of a transfer function between an output and an input of a device under test (DUT), the method comprising the steps of:

applying a sine sweep $x_1[n]$ to an input of the DUT, with n designating a time index;

measuring a response signal $y_1[n]$ at an output of the DUT;

applying a cosine sweep $x_2[n]$ to an input of the DUT;

measuring a response signal $y_2[n]$ at the output of the DUT;

estimating the magnitude A[n] and the phase Φ[n] of the transfer function between the output and the input of the DUT with the aid of the following formulas:

$$A[n] = \sqrt{\frac{y_1^2[n] + y_2^2[n]}{x_1^2[n] + x_2^2[n]}} \, , \, \Phi[n] = \arctan\left(\frac{y_1[n]}{x_2[n]}\right) - \arctan\left(\frac{x_1[n]}{x_2[n]}\right)$$

3. A method as claimed in claim 1, wherein the DUT is a converter for converting signals between an analog and a digital domain, and that the method further comprises the steps of:

generating a synthesized response signal y[n] corresponding to one of the sweeps $x_1[n]$ and $x_2[n]$, the synthesized response signal y[n] having a magnitude $A_y[n]$ and a relative phase $\Phi_y[n]$ being derived with the aid of formulas:

$$A_y[n] = \sqrt{y_1^2[n] + y_2^2[n]} \, , \, \Phi_y[n] = \arctan\left(\frac{y_1[n]}{y_2[n]}\right) - \arctan\left(\frac{x_1[n]}{x_2[n]}\right);$$

generating an error signal e[n] by subtracting the synthesized response signal y[n] and the relevant one of the response signals $y_1[n]$ and $y_2[n]$ from each other;

estimating noise and distortion specifications of the converter on the basis of the error signal e[n].

4. The method as claimed in claim 3, including, in the analyzing step, the step of obtaining a power spectrum of the error signal e[n] by averaging squares $e^2[n]$ in a sliding window.

5. An arrangement for obtaining transfer characteristics of a DUT as a function of frequency, wherein the arrangement comprises:

a waveform-generator arranged to provide an input of the DUT with a concatenation of a sine sweep and a cosine sweep, the cosine sweep being applied at a fixed time interval relative to the inputting of the sine sweep such that the cosine sweep is orthogonal to the sine sweep at the same frequency;

a digital signal processor for analyzing a complex response of the DUT.

6. An arrangement as claimed in claim 5, wherein the DUT is a converter for converting signals between an analog and a digital domain; and the digital signal further generates an error signal being a difference of a synthesized response signal and an actual response signal and analyzes noise and distortion specifications of the converter on the basis of the error signal.

7. An integrated circuit (IC) comprising a waveform generator, a digital signal processor and a subcircuit with transfer characteristics to be tested, wherein:

the IC comprises control circuitry controls the waveform generator and the digital signal processor;

the waveform generator provides an input of the subcircuit with a concatenation of a sine sweep and a cosine sweep, wherein the cosine sweep is applied at a fixed time interval relative to the inputting of the sine sweep such that the cosine sweep is orthogonal to the sine sweep at the same instantaneous frequency and;

the digital signal processor analyzes a complex response signal of the subcircuit.

* * * * *